US012633912B2

(12) United States Patent (10) Patent No.: US 12,633,912 B2
Jung et al. (45) Date of Patent: May 19, 2026

(54) POWER GATING CIRCUIT AND A SEMICONDUCTOR CHIP INCLUDING THE SAME

(71) Applicant: SAMSUNG ELECTRONICS CO., LTD., Suwon-si (KR)

(72) Inventors: Jinook Jung, Suwon-si (KR); Jaewoo Park, Suwon-si (KR); Myoungbo Kwak, Suwon-si (KR); Junghwan Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 77 days.

(21) Appl. No.: 18/515,355

(22) Filed: Nov. 21, 2023

(65) Prior Publication Data

US 2024/0195406 A1 Jun. 13, 2024

(30) Foreign Application Priority Data

Dec. 9, 2022 (KR) ........................ 10-2022-0172004

(51) Int. Cl.
    *H03K 17/30* (2006.01)
    *H03K 17/687* (2006.01)
    *H03K 19/0185* (2006.01)
(52) U.S. Cl.
    CPC ......... *H03K 17/302* (2013.01); *H03K 17/687* (2013.01); *H03K 19/018507* (2013.01); *H03K 2217/0081* (2013.01)
(58) Field of Classification Search
    CPC ........................... H03K 17/302; H03K 17/687
    USPC .................................................. 327/108–112
    See application file for complete search history.

(56) References Cited

U.S. PATENT DOCUMENTS

| | | | |
|---|---|---|---|
| 7,109,558 B2 | 9/2006 | Nakano et al. | |
| 8,624,678 B2 | 1/2014 | Scott et al. | |
| 9,214,932 B2 | 12/2015 | Clausen et al. | |
| 9,264,034 B2 | 2/2016 | Kim | |
| 9,673,800 B2 | 6/2017 | Chen et al. | |
| 10,147,724 B2 | 12/2018 | Madan et al. | |
| 11,418,185 B2 | 8/2022 | Wang et al. | |
| 2008/0197914 A1 | 8/2008 | Shimizu et al. | |
| 2016/0261263 A1* | 9/2016 | Chen ...................... H03K 17/06 |

FOREIGN PATENT DOCUMENTS

KR          10-1537792          7/2015

* cited by examiner

*Primary Examiner* — Tomi Skibinski
(74) *Attorney, Agent, or Firm* — Morgan, Lewis & Bockius LLP

(57) ABSTRACT

A power gating circuit including: a power gating transistor; a gate bias generating circuit configured to provide a gate bias control signal to the gate of the power gating transistor; and a body bias generating circuit configured to provide a body bias control signal to the body of the power gating transistor, wherein when the power gating transistor is turned on, the gate bias generating circuit provides the gate bias control signal having a positive voltage level and the body bias generating circuit provides the body bias control signal having the positive voltage level, and when the power gating transistor is turned off, the gate bias generating circuit provides the gate bias control signal having a ground voltage level or a negative voltage level, and the body bias generating circuit provides the body bias control signal having the ground voltage level or the negative voltage level.

20 Claims, 9 Drawing Sheets

| Gate Bias Generating Circuit | GBCS | BBCS | Body Bias Generating Circuit |

FIG.2

POWER GATING CIRCUIT AND A SEMICONDUCTOR CHIP INCLUDING THE SAME

CROSS-REFERENCE TO RELATED APPLICATION(S)

This application claims priority under 35 U.S.C. 119 to Korean Patent Application No. 10-2022-0172004, filed on Dec. 9, 2022, in the Korean Intellectual Property Office, the disclosure of which is incorporated by reference herein in its entirety.

TECHNICAL FIELD

The present disclosure relates to a power gating circuit.

DISCUSSION OF RELATED ART

A semiconductor memory device is a type of memory device that is implemented using a semiconductor material, such as silicon (Si), germanium (Ge), gallium arsenide (GaAs), indium phosphide (InP), or the like. Semiconductor memory devices may be categorized into volatile memory devices and nonvolatile memory devices.

Reducing leakage current is a significant concern in semiconductor memory devices. A power gating method is one technique for reducing leakage current. In general, decreasing the size of a power gating transistor leads to a reduction in leakage current. However, this reduction in the size leads to increased resistance in a turned-on state of the power gating transistor, and consequently, higher power consumption. In contrast, increasing the size of the power gating transistor to reduce resistance in its turned-on state may lead to incomplete blocking of the leakage current.

SUMMARY

Example embodiments of the present disclosure provide a power gating circuit which may significantly reduce resistance in a turned-on state while reducing leakage current.

According to an example embodiment of the present disclosure, there is provided a power gating circuit including: a power gating transistor; a gate bias generating circuit connected to a gate of the power gating transistor and configured to provide a gate bias control signal to the gate of the power gating transistor; and a body bias generating circuit connected to a body of the power gating transistor and configured to provide a body bias control signal to the body of the power gating transistor, wherein when the power gating transistor is turned on, the gate bias generating circuit provides the gate bias control signal having a positive voltage level to the gate of the power gating transistor and the body bias generating circuit provides the body bias control signal having the positive voltage level to the body of the power gating transistor, and when the power gating transistor is turned off, the gate bias generating circuit provides the gate bias control signal having a ground voltage level or a negative voltage level to the gate of the power gating transistor, and the body bias generating circuit provides the body bias control signal having the ground voltage level or the negative voltage level to the body of the power gating transistor.

According to an example embodiment of the present disclosure, there is provided a semiconductor chip including: a first power gating transistor connected to a first internal circuit and configured to provide a first power supply voltage to the first internal circuit; a second power gating transistor connected to a second internal circuit, different from the first internal circuit, and configured to provide a second power supply voltage to the second internal circuit; and a control circuit configured to control a switching operation of the first power gating transistor and the second power gating transistor, wherein a level of a voltage, provided to a body of the first power gating transistor, is different from a level of a voltage provided to a body of the second power gating transistor.

According to an example embodiment of the present disclosure, there is provided a power gating circuit including: a first power gating transistor disposed between an internal circuit and a ground voltage; a second power gating transistor disposed between the internal circuit and a power supply voltage; a gate bias generating circuit configured to provide a gate bias control signal to a gate of the first power gating transistor; and a body bias generating circuit configured to provide a body bias control signal to a body of the first power gating transistor, wherein when the first and second power gating transistors are turned on, the gate bias generating circuit and the body bias generating circuit provide the gate bias control signal having a positive voltage level and the body bias control signal having the positive voltage level, respectively, to the first power gating transistor, and when the first and power gating transistors are turned off, the gate bias generating circuit provides the gate bias control signal, having a ground voltage level or a negative voltage level, and the body bias generating circuit provides the body bias control signal, having the ground voltage level or the negative voltage level, respectively, to the first power gating transistor.

BRIEF DESCRIPTION OF THE DRAWINGS

The above and other features of the present disclosure will be more clearly understood from the following detailed description, taken in conjunction with the accompanying drawings.

FIG. 1 is a block diagram of a power gating circuit according to an example embodiment of the present disclosure, FIG. 2 is a circuit diagram illustrating an example of the power gating circuit of FIG. 1.

DETAILED DESCRIPTION OF THE EMBODIMENTS

Figure 3A:
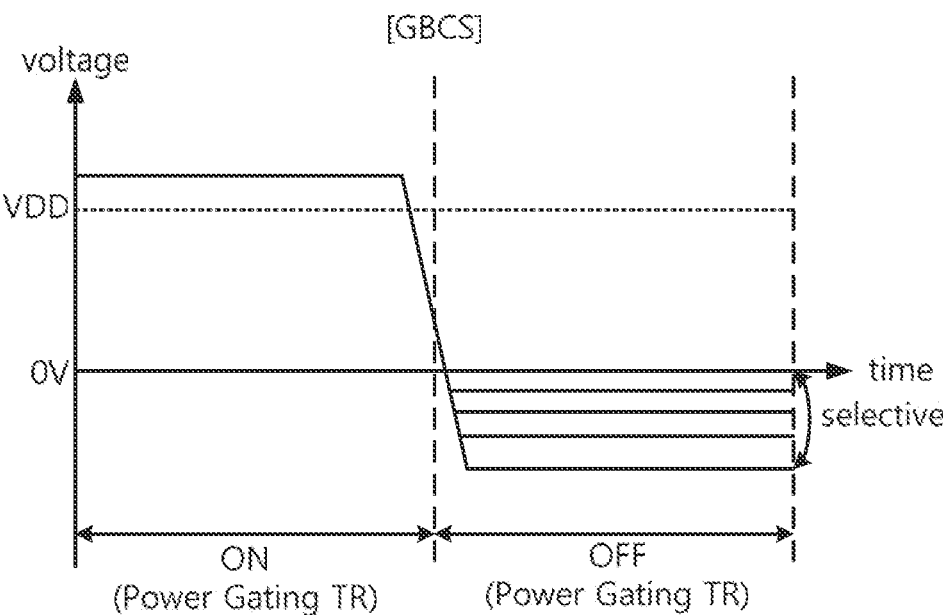
FIGS. 3A and 3B are diagrams, respectively illustrating an example of a gate bias control signal and an example of a body bias control signal of FIG. 2.

Hereinafter, example embodiments of the present disclosure will be described with reference to the accompanying drawings.

Figure 1:
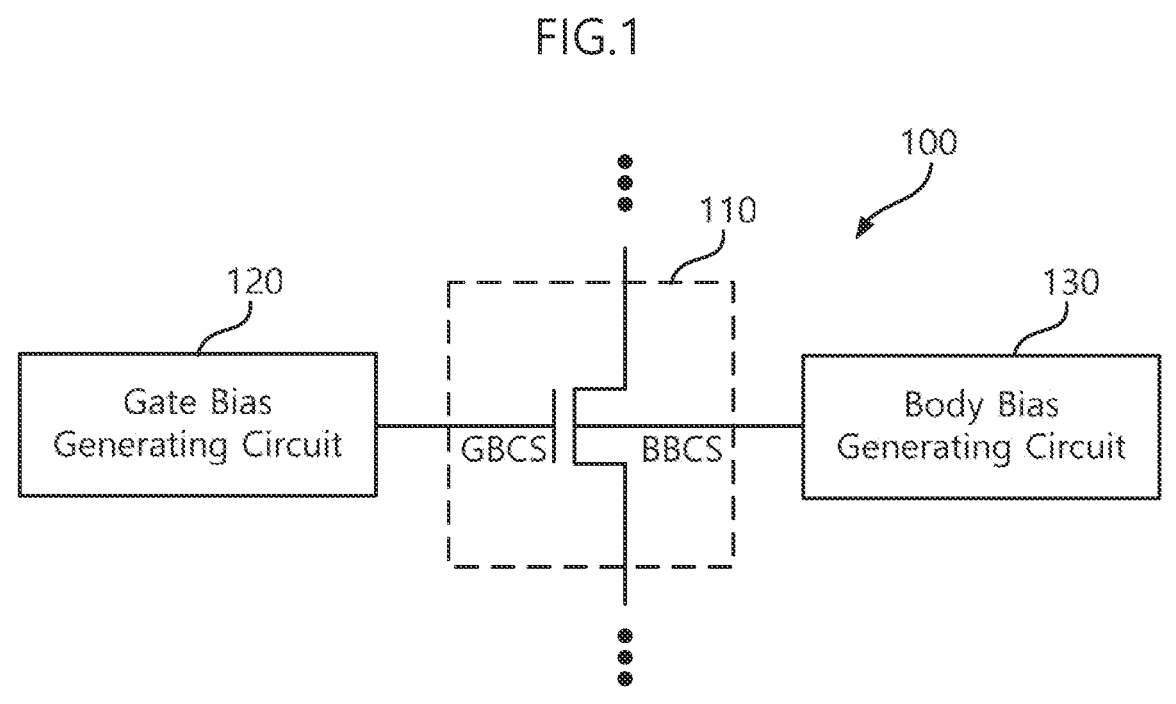

FIG. 1 is a block diagram of a power gating circuit 100 according to an example embodiment of the present disclosure.

The power gating circuit 100 may include a power gating transistor 110. A positive voltage may be provided to a gate and a body of the power gating transistor 110 when the power gating transistor 110 is turned on, and a negative voltage may be provided to the gate and the body of the power gating transistor 110 when the power gating transistor 110 is turned off. Accordingly, leakage current from an internal circuit to which the power gating circuit 100 is connected may be effectively blocked, and resistance in a turned-on state of the power gating transistor 110 may be significantly reduced.

The power gating circuit 100 may include the power gating transistor 110, a gate bias generating circuit 120, and a body bias generating circuit 130.

The power gating transistor 110 may be connected to an internal circuit, and may block leakage current from the internal circuit or perform a switching operation to provide a driving voltage to the internal circuit.

For example, in a sleep mode of the internal circuit, the power gating transistor 110 may be turned off. Accordingly, a driving voltage (for example, a power supply voltage) provided to the internal circuit may be cut off, or a connection between the internal circuit and a ground voltage may be cut off.

For example, in a normal active mode of the internal circuit, the power gating transistor 110 may be turned on. Accordingly, a driving voltage may be provided to an internal circuit including transistors, each having a relatively low threshold voltage level, or the internal circuit and a ground voltage may be connected to each other.

The gate bias generating circuit 120 may be connected to the gate of the power gating transistor 110. For example, the gate bias generating circuit 120 may be directly connected to the gate of the power gating transistor 110. The gate bias generating circuit 120 may generate a gate bias control signal GBCS, and may provide the gate bias control signal GBCS to the gate of the power gating transistor 110.

The body bias generating circuit 130 may be connected to the body of the power gating transistor 110. For example, the body bias generating circuit 130 may be directly connected to the body of the power gating transistor 110. The body bias generating circuit 120 may generate a body bias control signal BBCS, and may provide the body bias control signal BBCS to the body of the power gating transistor 110.

In an example embodiment of the present disclosure, in the sleep mode of the internal circuit, the gate bias generating circuit 120 and the body bias generating circuit 130 may respectively generate a gate bias control signal GBCS having a negative voltage level and a body bias control signal BBCS having a negative voltage level, and may provide the bias control signals GBCS and BBCS to the power gating transistor 110. For example, the power gating transistor 110 may be provided with the gate bias control signal GBCS and the body bias control signal BBCS each having a first level in the sleep mode of the internal circuit. Accordingly, a threshold voltage Vth of the power gating transistor 110 may have a level that is higher than a level a threshold voltage of a general power gating transistor. As a result, leakage current from the internal circuit may be effectively blocked.

In an example embodiment of the present disclosure, in the normal active mode of the internal circuit, the gate bias generating circuit 120 and the body bias generating circuit 130 may respectively generate a gate bias control signal GBCS having a positive voltage level and a body bias control signal BBCS having a positive voltage level, and may provide the bias control signals GBCS and BBCS to the power gating transistor 110. For example, the power gating transistor 110 may be provided with the gate bias control signal GBCS and the body bias control signal BBCS each having a second level different from the first level in the normal active mode of the internal circuit. Accordingly, a threshold voltage Vth of the power gating transistor 110 may have a level that is lower than a level of a threshold voltage of a general power gating transistor. As a result, resistance Ron in a turned-on state of the power gating transistor 110 may be decreased to significantly reduce power consumption and current caused by the power gating transistor 110.

As described above, the power gating circuit 100 may include the gate bias generating circuit 120 and the body bias generating circuit 130 to provide a positive voltage and/or a negative voltage, other than a power supply voltage or a ground voltage, to the gate and the body of the power gating transistor 110. Accordingly, the power gating circuit 100 may reduce current leaking in the turned-off state and may significantly reduce current leaking in the turned-on state to reduce power consumption.

Figure 2:
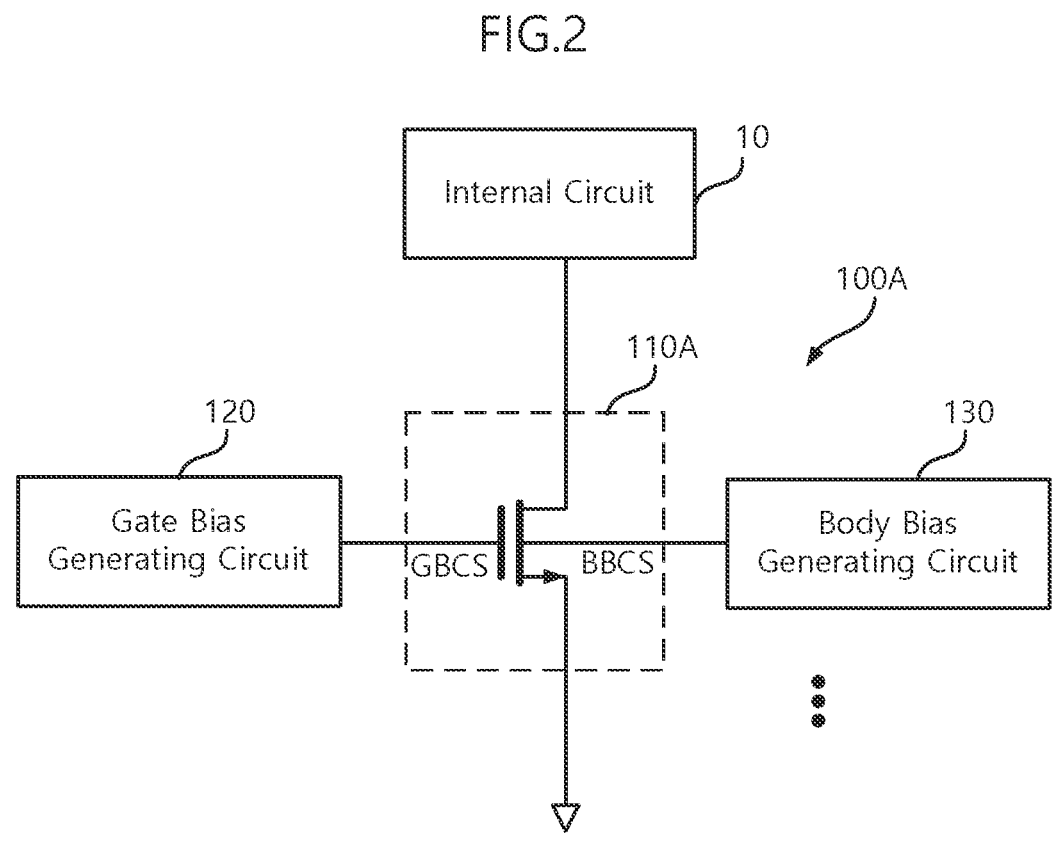

FIG. 2 is a circuit diagram illustrating an example of the power gating circuit 100 of FIG. 1. FIG. 2 illustrates an example in which a power gating circuit 100A is implemented using a power gating transistor, e.g., an NMOS transistor. For ease of description, in FIG. 2, it will be assumed that the power gating circuit 100A is connected between an internal circuit 10 and a ground voltage.

Referring to FIG. 2, the power gating circuit 100A may include a power gating transistor 110A, a gate bias generating circuit 120, and a body bias generating circuit 130, and the power gating transistor 100A may be an NMOS transistor.

The power gating transistor 110A may be connected between the internal circuit 10 and a ground voltage GND and may have a gate for receiving a gate bias control signal GBCS generated by the gate bias generating circuit 120, and a body for receiving a body bias control signal BBCS generated from the bias generating circuit 130.

The internal circuit 10 may be a semiconductor memory device such as a flash memory device. For example, in the context of a flash memory device, it is common for some lines to float during write, read, or erase operations. To ensure an accurate operation, it is important to maintain the floating state of these lines. Therefore, it is essential to prevent leakage current from being introduced into or discharged from the floating lines. In addition, the internal circuit 10 may be various types of arithmetic circuits, logic circuits, memories, caches, or the like, incorporated in the semiconductor device. It is imperative to block leakage current within these circuits to ensure accurate operations.

In an example embodiment of the present disclosure, to effectively block the leakage current from the internal circuit 10, a gate bias control signal GBCS having a negative voltage level and a body bias control signal BBCS having a negative voltage level may be respectively provided to a gate and a body of the power gating transistor 110A when the power gating transistor 110 is turned off. Accordingly, a threshold voltage Vth of the power gating transistor 100A may be increased, and leakage current in a direction from the internal circuit 10 toward the ground voltage GND may be effectively blocked.

In addition, in an example embodiment of the present disclosure, a gate bias control signal GBCS having a positive voltage level and a body bias control signal BBCS having a positive voltage level may be respectively provided to a gate and a body of the power gating transistor 110A when the power gating transistor 110A is turned off. Accordingly, a threshold voltage Vth of the power gating transistor 100A may be decreased, and resistance in a turned-on state of the power-gating transistor 100A may be significantly decreased.

Figure 3B:
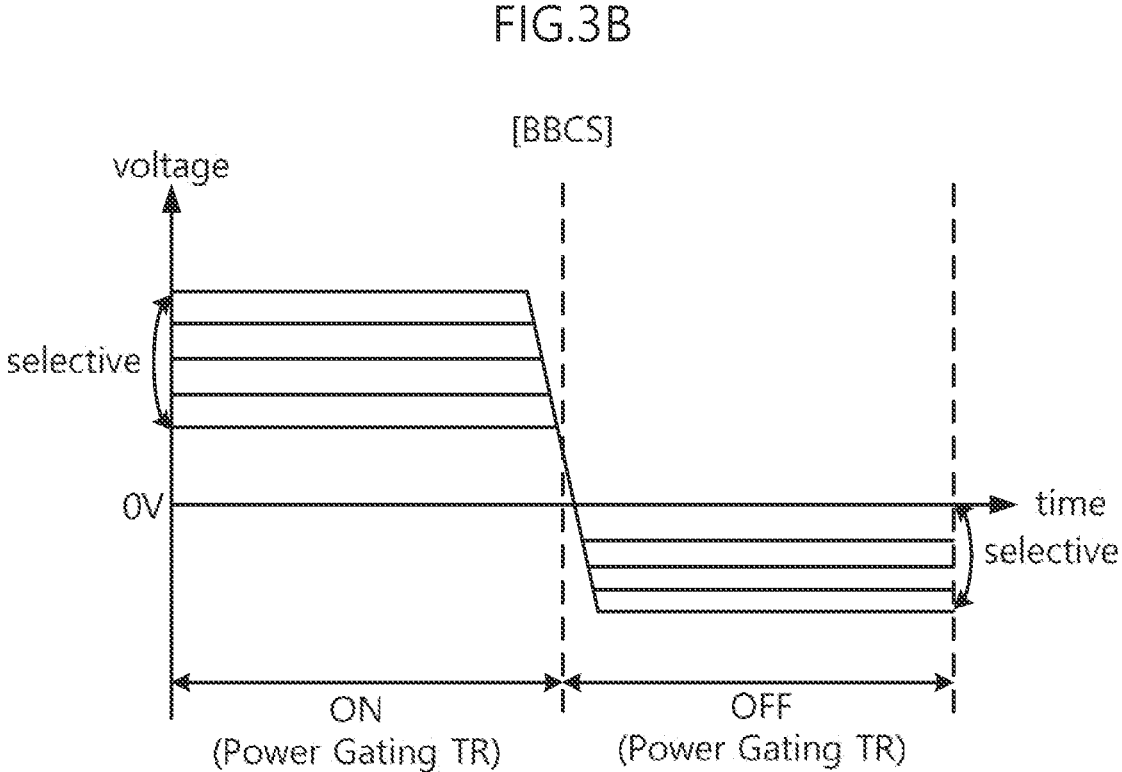

FIGS. 3A and 3B are diagrams, respectively illustrating an example of the gate bias control signal GBCS and an example of the body bias control signal BBCS of FIG. 2.

Referring to FIGS. 2 and 3A, the gate bias control signal GBCS may have a positive voltage level when the power gating transistor 110A is turned on. For example, the voltage level of the gate bias control signal GBCS may be higher than a voltage level of a power supply voltage VDD, and thus the power gating transistor 110A may be turned on.

The gate bias control signal GBCS may have a ground voltage level or a negative voltage level when the power gating transistor 110A is turned off. For example, the voltage level of the gate bias control signal GBCS is not limited to the ground voltage level, and the gate bias control signal GBCS may have various voltage levels, lower than the ground voltage level.

Referring to FIGS. 2 and 3B, the body bias control signal BBCS may have a positive voltage level when the power gating transistor 10A is turned on. For example, the body bias control signal BBCS may have various positive voltage levels. Accordingly, the threshold voltage Vth of the power gating transistor 110A may be decreased, and resistance Ron in a turned-on state of the power gating transistor 110A may be decreased.

In addition, the body bias signal BBCS may have a ground voltage level or a negative voltage level when the power gating transistor 110A is turned off. For example, the body bias control signal BBCS may have various voltage levels, lower than the ground voltage level. Accordingly, the threshold voltage Vth of the power gating transistor 110A may be increased, and leakage current from the internal circuit 10 may be effectively blocked.

According to example embodiments of the present disclosure, the gate bias control signal GBCS and/or the body bias control signal BBCS may be set to have various voltage levels.

In an example embodiment of the present disclosure, the gate bias generating circuit 120 and/or the body bias generating circuit 130 may set the voltage level of the gate bias control signal GBCS and/or the voltage level of the body bias control signal BBCS based on a size of the power gating transistor 110A.

Figure 4:
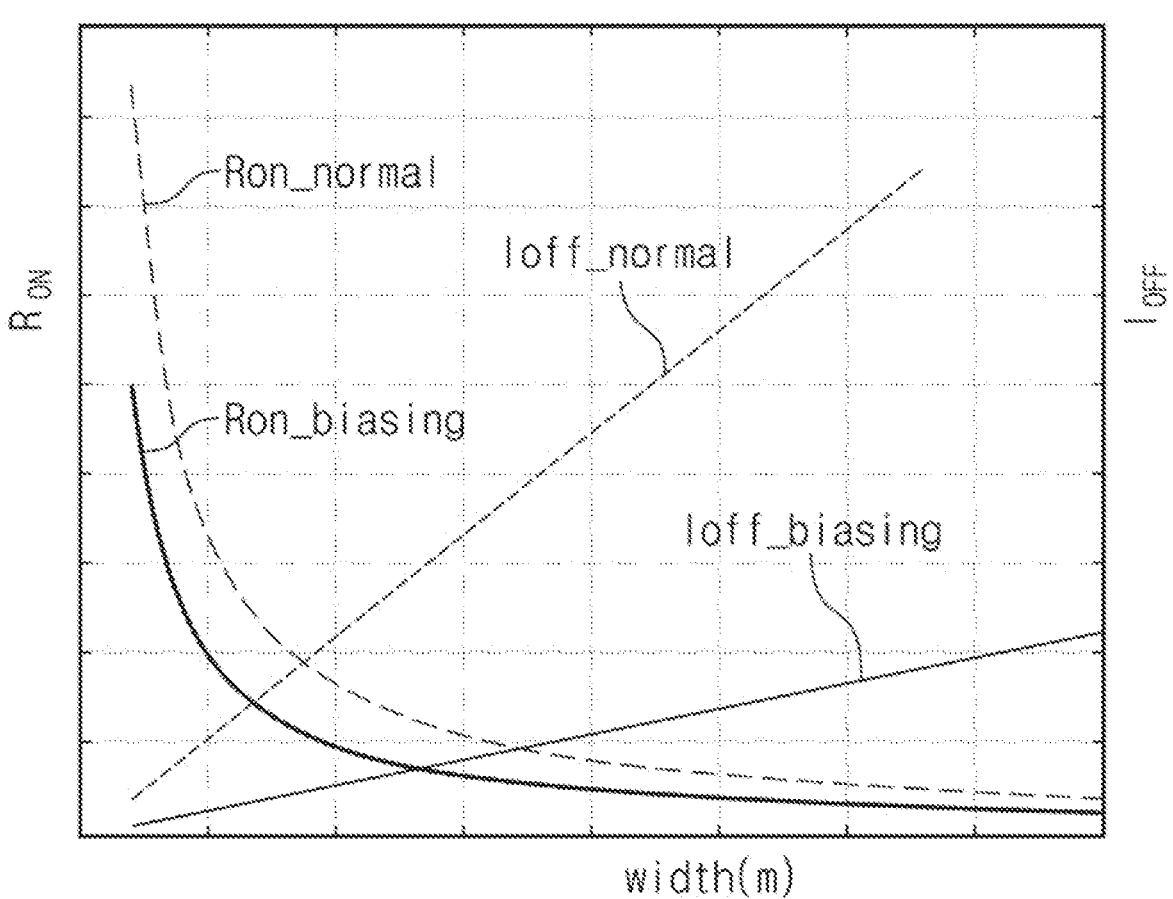
FIG. 4 is a diagram provided to describe an effect of the power gating circuit according to an example embodiment of the present disclosure.

For example, when the size of the power gating transistor increases, the leakage current may also increase, as illustrated in FIG. 4 below. In addition, as the voltage level of the body bias control signal BBCS decreases, the threshold voltage of the power gating transistor 110A increases. Accordingly, as the size of the power gating transistor 110a is increased, the body bias generating circuit according to an example embodiment of the present disclosure may generate a body bias control signal BBCS having a lower negative voltage level. As a result, leakage current may be effectively blocked even when the size of the power gating transistor 110A is large.

In an example embodiment of the present disclosure, the gate bias generating circuit 120 and/or the body bias generating circuit 130 may set the voltage level of the gate bias control signal GBCS and/or the voltage level of the body bias control signal BBCS based on the type of the internal circuit 10.

For example, when the internal circuit 10 is a three-dimensional (3D) flash memory device, leakage current needs to be blocked to have an accurate operation. In this case, the body bias generating circuit 130 according to an example embodiment of the present disclosure may generate a body bias control signal BBCS having a lower negative voltage level, and thus leakage current may be effectively blocked.

FIG. 4 is a diagram provided to describe an effect of the power gating circuit 100 according to an example embodiment of the present disclosure. As an example, FIG. 4 illustrates a result when a body bias control signal BBCS having a negative voltage level is applied to the body of the power gating transistor 110A.

In FIG. 4, "Ron_normal" denotes resistance in a turned-on state of a general power gating circuit, and "Ron_bias-ing" denotes resistance when a body bias control signal BBCS having a negative voltage level is applied to a body of the power gating transistor 110A according to an example embodiment of the present disclosure. In addition, "Ioff_normal" denotes leakage current in a turned-off state of the general power gating circuit, and "Ioff_biasing" denotes leakage current when the body bias control signal BBCS having the negative voltage level is applied to the body of the power gating transistor 110A according to an example embodiment of the present disclosure.

As illustrated in FIG. 4, as compared with the general power gating circuit, the power gating circuit 100 according to example embodiments may reduce leakage current, and may significantly reduce resistance in a turned-on state.

Figure 5:
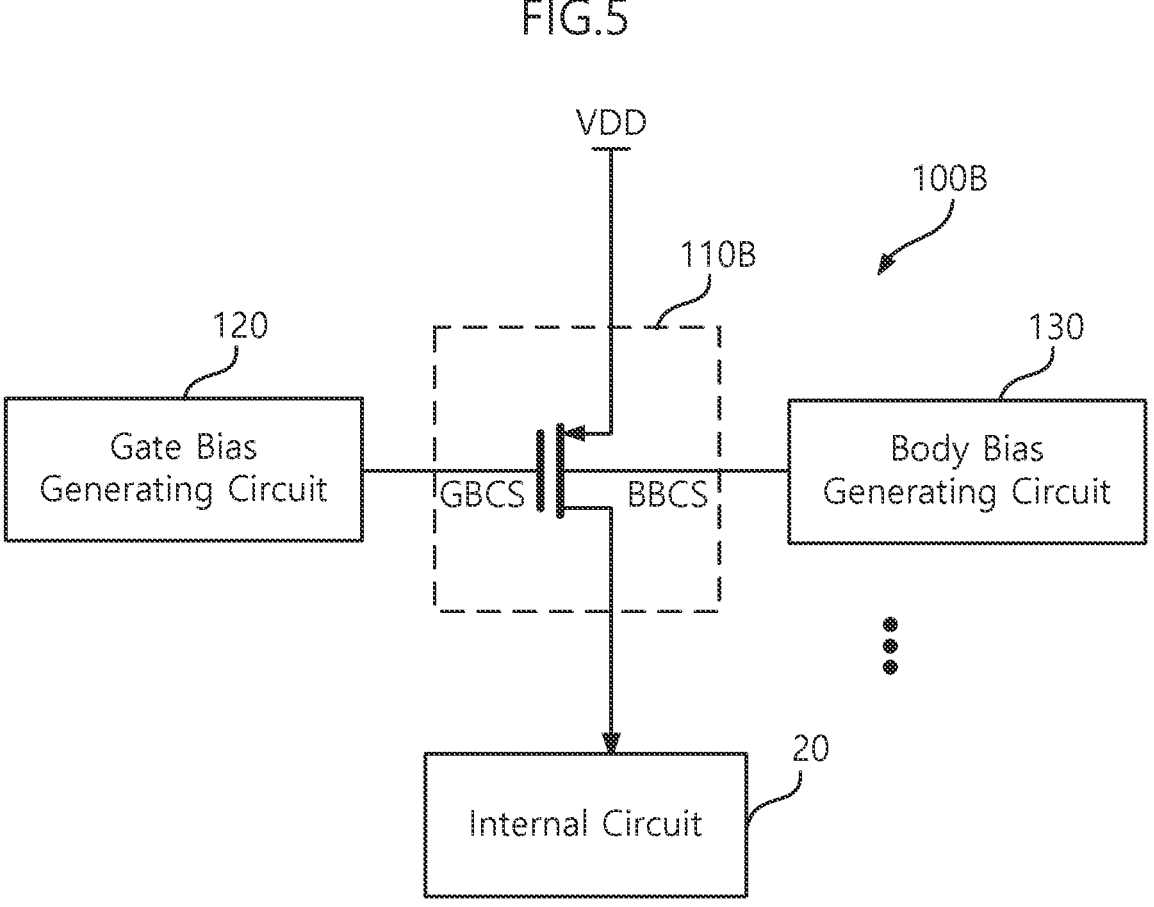
FIG. 5 is a circuit diagram illustrating another example of the power gating circuit of FIG. 1.

FIG. 5 is a circuit diagram illustrating another example of the power gating circuit 100 of FIG. 1. FIG. 5 illustrates an example in which a power gating circuit 1001B is implemented using a power gating transistor, e.g., a PMOS transistor. For ease of description, in FIG. 5, it will be assumed that the power gating circuit 100B is connected between a power supply voltage VDD and an internal circuit 20. The power gating circuit 100B of FIG. 5 is similar to the power gating circuit 100A of FIG. 2. Therefore, repetitive descriptions will be omitted for brevity of description.

Referring to FIG. 5, the power gating circuit 100B may include a power gating transistor 110B, a gate bias generating circuit 120, and a body bias generating circuit 130, and the power gating transistor 111B may be a PMOS transistor.

The power gating transistor 101B may be connected between a power supply voltage VDD and an internal circuit 20 to perform a switching operation to transfer the power supply voltage VDD to the internal circuit 20. A gate of the power gating transistor 110B may receive a gate bias control signal GBCS generated by the gate bias generating circuit 120, and a body of the power gating transistor 10B may receive a body bias control signal BBCS generated by the body bias generating circuit 130.

The internal circuit 10 may be various types of arithmetic circuits, logic circuits, memories, caches, or the like. The internal circuit 10 may be implemented to include transistors 110B, each having a relatively low threshold voltage, and may be supplied with the power supply voltage VDD through the power gating transistor 110B to operate. Accordingly, in a normal active mode of the internal circuit 20, resistance in a turned-on state of the power gating transistor 110B should be decreased.

In an example embodiment of the present disclosure, a gate bias control signal GBCS having a positive voltage level and a body bias control signal BBCS having a positive voltage level may be respectively provided to a gate and a body of the power gating transistor 110B to significantly reduce resistance Ron in a turned-on state of the power gating transistor 110B. Accordingly, a threshold voltage Vth of the power gating transistor 110B may be decreased as compared with a general power gating transistor, and thus power consumed by the power gating transistor 101B may be reduced and a maximum magnitude of current may be provided to the internal circuit 20.

Figure 6:
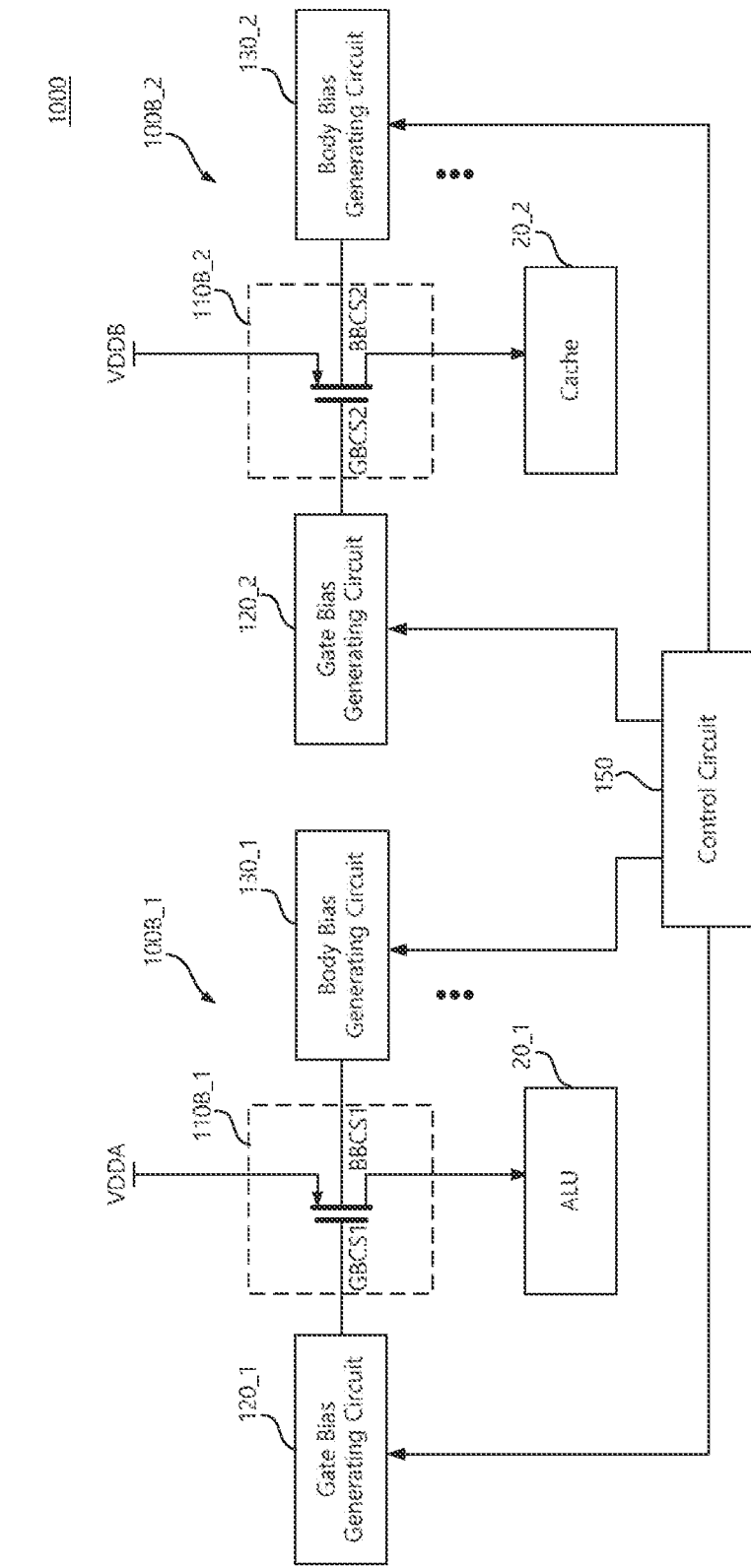
FIG. 6 is a diagram illustrating an example of a semiconductor chip to which the power gating circuit of FIG. 5 is applied.
Figure 7:
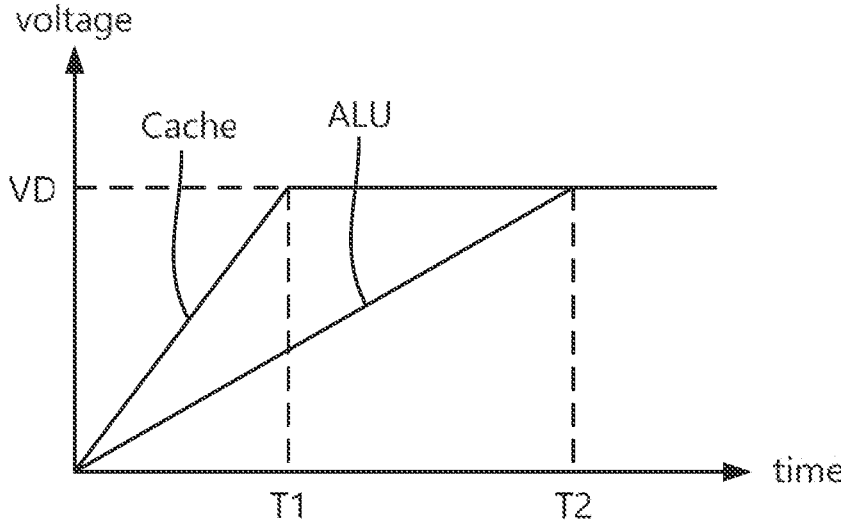
FIG. 7 is a diagram illustrating an example of a difference in time required to reach a stable voltage for each internal circuit in a general case.

FIG. 6 is a diagram illustrating an example of a semiconductor chip 1000 to which the power gating circuit 100B of FIG. 5 is applied. FIG. 7 is a diagram illustrating an example of a difference in time required to reach a stable voltage for each internal circuit in a general case. For ease of description, in FIGS. 6 and 7, it will be assumed that an arithmetic circuit 20_1 and a cache 20_2 are provided as internal circuits.

Referring to FIG. 6, the semiconductor chip 1000 may include a first power gating circuit 100B_1, a second power gating circuit 100B_2, an arithmetic logic unit (ALU) 20_1, a cache 20_2, and a control circuit 150.

The first power gating circuit 100B_1 may be connected between a first power supply voltage VDDA and the ALU 20_1, and may provide the first power voltage VDDA to the ALU 20_1.

The second power gating circuit 100B_2 may be connected between a second power supply voltage VDDB and the cache 20_2, and may provide the second power supply voltage VDDB to the cache 20_2.

The control circuit 150 may control a gate bias generating circuit 120_1 and a body bias generating circuit 1301 of the first power gating circuit 100B_1, and may control a gate bias generating circuit 1202 and a body bias generating circuit 1302 of the second power gating circuit 100B_2.

In general, the ALU 20_1 is relatively complex, as compared with the cache 20_2. Therefore, in a general case, the ALU 20_1 may require a relatively large amount of current to reach a stable voltage VD, as illustrated in FIG. 7. Accordingly, the time required to reach a relatively stable voltage for the ALU 201 may be long, as compared with the cache 20_2. The stable voltage refers to a voltage level at which an internal circuit operates normally.

In order for the ALLU 20_1 to reach the stable voltage VD more rapidly, the control circuit 150 according to an example embodiment of the present disclosure may control the first power gating circuit 100B_1 and the second power gating circuit 100B_2 such that the amount of current provided to the ALU 20_1 is larger than the amount of current provided to the cache 20_2.

For example, under the control of the control circuit 150, the first gate bias generating circuit 120_1 and the first body bias generating circuit 130_1 of the first power gating circuit 100B_1 may respectively generate a first gate bias control signal GBCS1 and a first body bias control signal BBCS1, and the second gate bias generating circuit 120_2 and the second body bias generating circuit 130_2 of the second power gating circuit 100B_2 may respectively generate a second gate bias control signal GBCS2 and a second body bias control signal BBCS2. In this case, a voltage level of the first gate bias control signal GBCS1 may be higher than a voltage level of the second gate bias control signal GBCS2, and a voltage level of the first body bias control signal BBCS1 may be higher than a voltage level of the second body bias control signal BBCS2. Accordingly, a threshold voltage of the first power gating transistor 110B_1 may be lower than a threshold voltage of the second power gating transistor 110B_2. As a result, a larger amount of current may be provided to the ALLU 20_1.

As described above, the semiconductor chip 1000 according to an example embodiment of the present disclosure may set a voltage level of the gate bias control signal GBCS and/or a voltage level of the body bias control signal BBCS to vary based on the amount of current required by an internal circuit.

Figure 8:
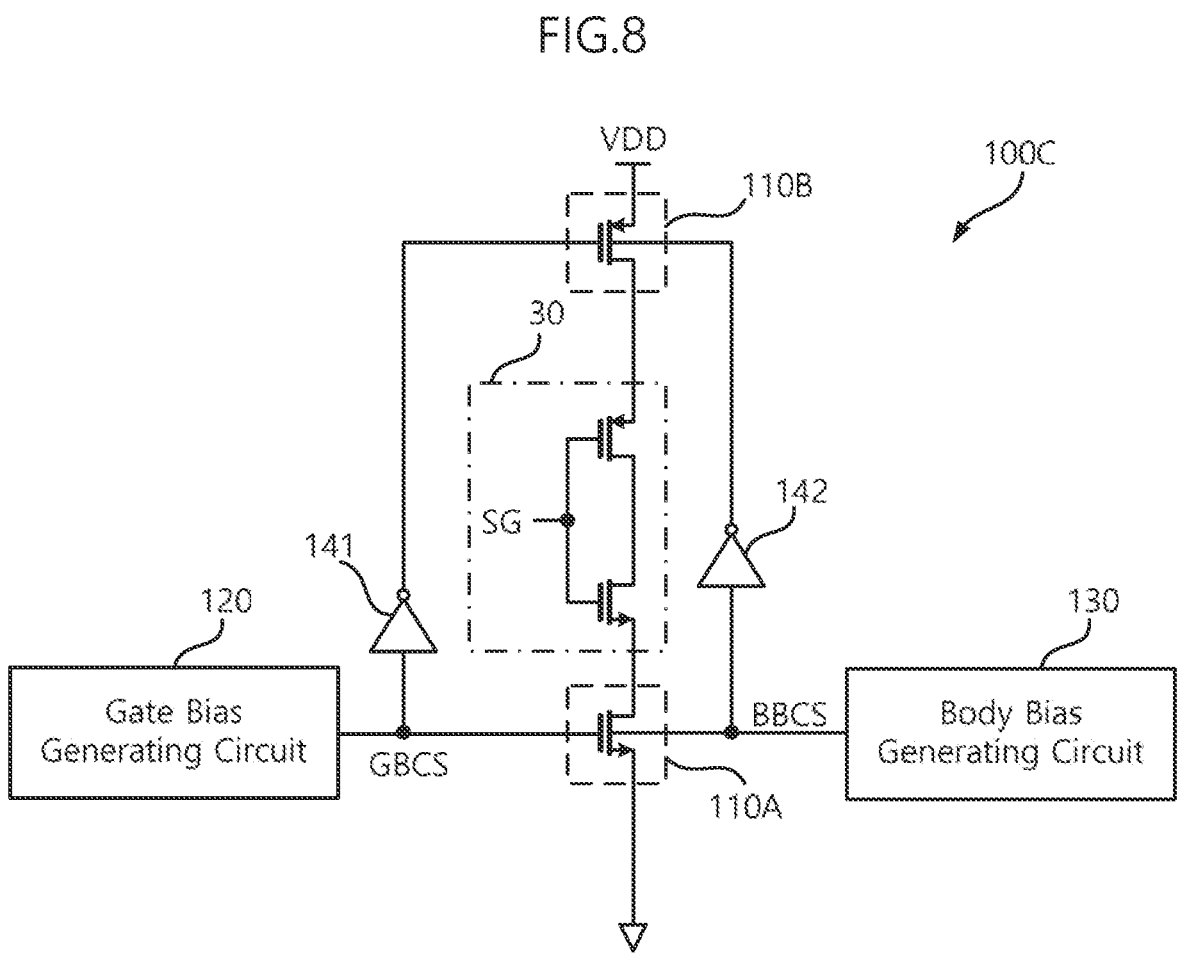
FIG. 8 is a circuit diagram illustrating another example of the power gating circuit of FIG. 1.

FIG. 8 is a circuit diagram illustrating another example of the power gating circuit 100 of FIG. 1. FIG. 8 illustrates an example in which a power gating circuit 100C is implemented using both a power gating transistor, which is an NMOS transistor, and a power gating transistor which is a PMOS transistor. The power gating circuit 100C of FIG. 8 is similar to the power gating circuits 100A and 100B of FIGS. 2 and 5. Therefore, repetitive descriptions will be omitted for brevity of description.

Referring to FIG. 8, the power gating circuit 100C may include a first power gating transistor 110A, a second power gating transistor 110B, a gate bias generating circuit 120, a body bias generating circuit 130, and inverters 141 and 142. The first power gating transistor 110A may be an NMOS transistor, and the second power gating transistor 110B may be a PMOS transistor.

The first inverter 141 may be connected to a gate of the first power gating transistor 110A and a gate of the second power gating transistor 110B. The first inverter 141 may be directly connected to the gate of the first power gating transistor 110A and the gate of the second power gating transistor 110B. The second inverter 142 may be connected to a body of the first power gating transistor 110A and a body of the second power gating transistor 110B. The second inverter 142 may be directly connected to the body of the first power gating transistor 110A and the body of the second power gating transistor 110B. Accordingly, the first power gating transistor 110A and the second power gating transistor 110B may be simultaneously turned on or turned off.

When the first power gating transistor 110A and the second power gating transistor 110B are simultaneously turned on, each of the gate bias control signal GBCS and the body bias control signal BBCS may have a positive voltage level. Accordingly, turn-on resistance may be significantly reduced.

When the first power gating transistor 110A and the second power gating transistor 110B are simultaneously turned off, each of the gate bias control signal GBCS and the body bias control signal BBCS may have a negative voltage level. Accordingly, leakage current from an internal circuit 30 can be effectively blocked. As shown in FIG. 8, the internal circuit 30 may include a pair of transistors respectively connected to the first power gating transistor 110A and the second power gating transistor 110B. A signal SG may be provided to a gate of each of the transistors in the internal circuit 30.

As described above, a power gating circuit may reduce leakage current and may significantly reduce resistance in a turned-on state.

While example embodiments of the present disclosure have been shown and described above, it will be apparent to those skilled in the art that modifications and variations could be made thereto without departing from the scope of the present disclosure as set forth by the appended claims.

What is claimed is:
1. A power gating circuit comprising:
a power gating transistor;
a gate bias generating circuit connected to a gate of the power gating transistor and configured to provide a gate bias control signal to the gate of the power gating transistor to control a level of a voltage applied to the gate based on On/Off state of the power gating transistor; and a body bias generating circuit connected to a body of the power gating transistor and configured to provide a body bias control signal to the body of the power gating transistor, wherein the level of the voltage applied to the gate includes a positive voltage level, a ground voltage level and a negative voltage level, and wherein:

after the power gating transistor is turned on, the gate bias generating circuit provides the gate bias control signal having the positive voltage level to the gate of the power gating transistor and the body bias generating circuit provides the body bias control signal having the positive voltage level to the body of the power gating transistor, and after the power gating transistor is turned off, the gate bias generating circuit provides the gate bias control signal having the ground voltage level or the negative voltage level to the gate of the power gating transistor, and the body bias generating circuit provides the body bias control signal having the ground voltage level or the negative voltage level to the body of the power gating transistor.

2. The power gating circuit of claim 1, wherein the body bias generating circuit sets a voltage level of the body bias control signal based on a size of the power gating transistor.

3. The power gating circuit of claim 2, wherein the body bias generating circuit generates the body bias control signal having a lower negative voltage level as the size of the power gating transistor is increased.

4. The power gating circuit of claim 3, wherein the power gating transistor is an NMOS transistor.

5. The power gating circuit of claim 1, wherein the body bias generating circuit sets a voltage level of the body bias control signal based on a type of an internal circuit to which the power gating transistor is connected.

6. The power gating circuit of claim 1, wherein the body bias generating circuit sets a voltage level of the body bias control signal based on an amount of current consumed by an internal circuit to which the power gating transistor is connected.

7. The power gating circuit of claim 6, wherein the body bias generating circuit generates the body bias control signal having a higher positive voltage level as the amount of the current consumed by the internal circuit is increased.

8. The power gating circuit of claim 7, wherein the power gating transistor is a PMOS transistor.

9. The power gating circuit of claim 1, further comprising: an additional power gating transistor, wherein the power gating transistor is connected to an internal circuit and a ground voltage, wherein the additional power gating transistor is connected to a power supply voltage and the internal circuit.

10. The power gating circuit of claim 9, further comprising:

a first inverter connected to the gate of the power gating transistor and a gate of the additional power gating transistor; and a second inverter connected to the body of the power gating transistor and a body of the additional power gating transistor.

11. The power gating circuit of claim 10, wherein the power gating transistor and the additional power gating transistor are simultaneously turned on or turned off in response to the gate bias control signal and the body bias control signal.

12. The power gating circuit of claim 11, wherein the power gating transistor is an NMOS transistor, and the additional power gating transistor is a PMOS transistor.

13. A semiconductor chip comprising:

a first power gating transistor connected to a first internal circuit and configured to provide a first power supply voltage to the first internal circuit;

a second power gating transistor connected to a second internal circuit, different from the first internal circuit, and configured to provide a second power supply voltage to the second internal circuit; and a control circuit configured to control a switching operation of the first power gating transistor and the second power gating transistor, wherein a level of a voltage, provided to a body of the first power gating transistor, is different from a level of a voltage provided to a body of the second power gating transistor.

14. The semiconductor chip of claim 13, further comprising:

a first gate bias generating circuit configured to provide a first gate bias control signal to a gate of the first power gating transistor;

a first body bias generating circuit configured to provide a first body bias control signal to the body of the first power gating transistor;

a second gate bias generating circuit configured to provide a second gate bias control signal to a gate of the second power gating transistor; and a second body bias generating circuit configured to provide a second body bias control signal to the body of the second power gating transistor.

15. The semiconductor chip of claim 14, wherein a voltage level of the first gate bias control signal is higher than a voltage level of the second gate bias control signal.

16. The semiconductor chip of claim 14, wherein a voltage level of the first body bias control signal is higher than a voltage level of the second body bias control signal.

17. The semiconductor chip of claim 13, wherein a time required for the first internal circuit to reach a stable voltage is longer than a time required for the second internal circuit to reach a stable voltage.

18. A power gating circuit comprising:

a first power gating transistor disposed between an internal circuit and a ground voltage;

a second power gating transistor disposed between the internal circuit and a power supply voltage;

a gate bias generating circuit configured to provide a gate bias control signal to a gate of the first power gating transistor; and a body bias generating circuit configured to provide a body bias control signal to a body of the first power gating transistor, wherein when the first and second power gating transistors are turned on, the gate bias generating circuit and the body bias generating circuit provide the gate bias control signal having a positive voltage level and the body bias control signal having the positive voltage level, respectively, to the first power gating transistor, and when the first and power gating transistors are turned off, the gate bias generating circuit provides the gate bias control signal, having a ground voltage level or a negative voltage level, and the body bias generating circuit provides the body bias control signal, having the ground voltage level or the negative voltage level, respectively, to the first power gating transistor.

19. The power gating circuit of claim 18, further comprising:

a first inverter disposed between the gate of the first power gating transistor and a gate of the second power gating transistor; and a second inverter disposed between the body of the first power gating transistor and a body of the second power gating transistor.

20. The power gating circuit of claim 19, wherein the first inverter inverts the gate bias control signal and provides an inverted version of the gate bias control signal to the gate of the second power gating transistor, and the second inverter inverts the body bias control signal and provides an inverted version of the body bias control signal to the body of the second power gating transistor.

* * * * *